United States Patent [19]

Engeler et al.

[11] 4,241,263
[45] Dec. 23, 1980

[54] CHARGE TRANSFER DUAL FREQUENCY DELAY LINE WITH PHASE INDEPENDENT COUPLING

[75] Inventors: William E. Engeler; Richard D. Baertsch, both of Scotia, N.Y.

[73] Assignee: General Electric Company, Schenectady, N.Y.

[21] Appl. No.: 961,258

[22] Filed: Nov. 16, 1978

[51] Int. Cl.³ .................... G11C 19/28; H01L 29/78
[52] U.S. Cl. .................................. 307/221 D; 357/24
[58] Field of Search ....................... 357/24; 307/221 D

[56] References Cited

U.S. PATENT DOCUMENTS

| | | | |
|---|---|---|---|
| 3,763,480 | 10/1973 | Weimer | 357/24 |
| 3,824,337 | 7/1974 | Sangster et al. | 357/24 |
| 3,919,468 | 11/1975 | Weimer | 307/221 D |
| 3,925,805 | 12/1975 | Erb | 307/221 D |
| 4,027,260 | 5/1977 | Carnes et al. | 307/221 D |

OTHER PUBLICATIONS

Sequin et al. *Charge Transfer Devices* Academic Press, 1975, pp. 25–31, 39.

*Primary Examiner*—Gene M. Munson
*Attorney, Agent, or Firm*—Julius J. Zaskalicky; James C. Davis, Jr.; Marvin Snyder

[57] ABSTRACT

A charge transfer shift register is described in which a first section is operated at a first clock frequency, a second section is operated at a second clock frequency, and an intermediate section located between the first and second sections is operated at fixed potential.

1 Claim, 8 Drawing Figures

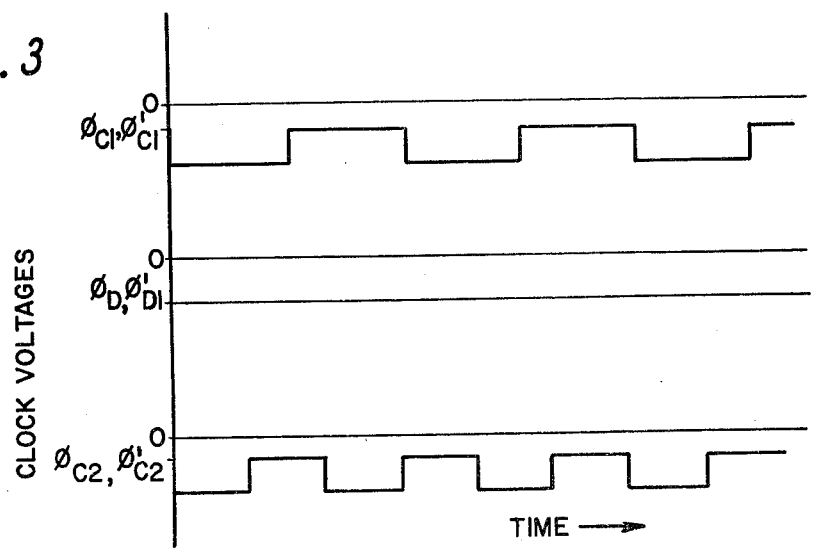
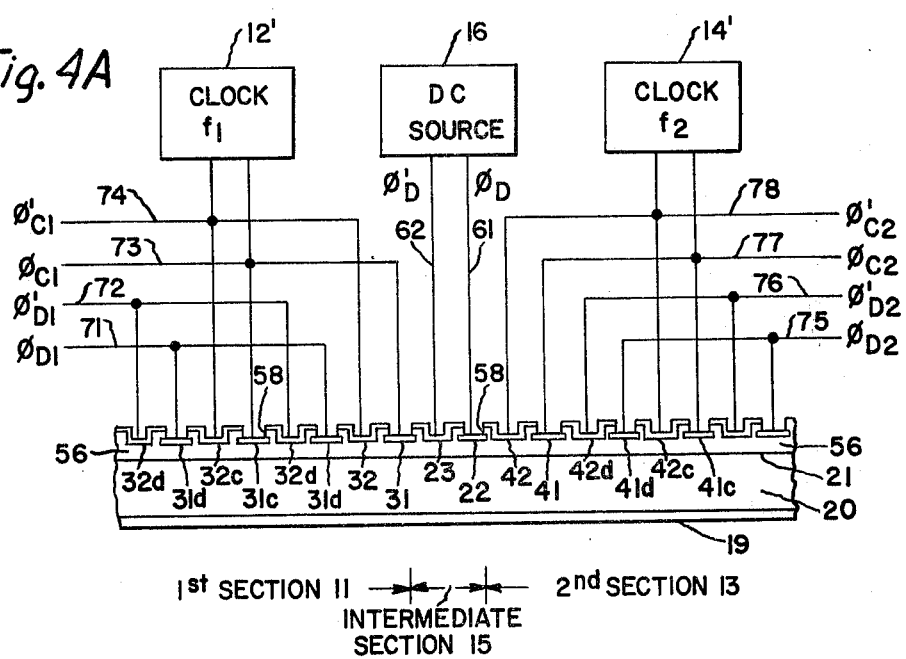
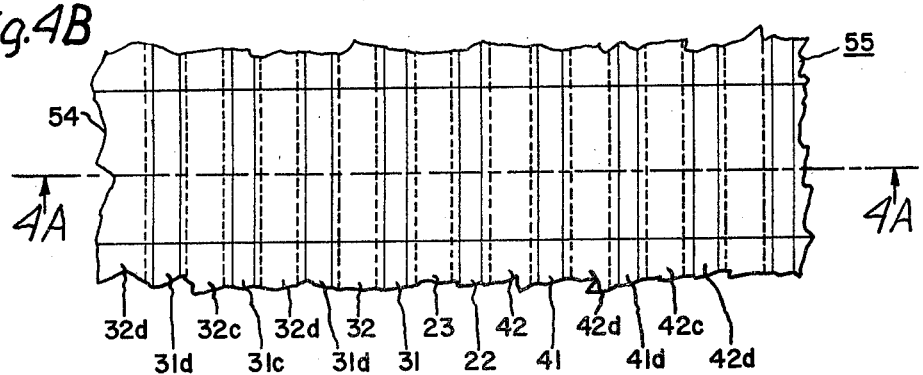

CHARGE TRANSFER DUAL FREQUENCY DELAY LINE WITH PHASE INDEPENDENT COUPLING

BACKGROUND OF THE INVENTION

This invention relates in general to charge transfer devices and in particular to charge transfer shift registers in which one section thereof is clocked at one frequency and another adjacent section thereof is clocked at another frequency.

In certain applications such as in ultrasound imaging apparatus wherein it is desirable to provide variable time delays in various signal channels, it is desirable to transfer charge from one charge transfer stage in a first charge transfer structure operated at one frequency directly into another charge transfer stage in a second charge transfer structure formed on the same substrate and clocked at a different frequency to provide a variable delay which is a function of the frequencies of the clocking voltages applied to the two structures. The transfer of charge from the first charge transfer structure directly into the second charge transfer structure presents a problem when the phases of the clocking voltages applied to the two structures are such as to prevent the transfer of charge directly from the last stage of the first charge transfer structure into the first stage of the second charge transfer structure. Such a condition causes charge to build up in the last cell of the first charge transfer structure and limits the dynamic range of the device.

SUMMARY OF THE INVENTION

The present invention is directed to the solution of problems such as described above in charge transfer shift registers.

In carrying out the invention in one illustrative embodiment thereof there is provided a charge transfer shift register including a first section, a second section and an intermediate charge transfer cell coupling the output of the first section to the input of the second section. The first section of the shift register is operated at a first clocking frequency and a second section of the shift register is operated at a second clocking frequency. The intermediate cell is operated at fixed dc voltage. Charge is transferred to the intermediate cell whenever the clocking voltage of the first charge transfer shift register is moved to its high or transmit position and charge is removed from the intermediate cell whenever the clocking voltage of the second charge transfer shift register is moved to its low or receive position. Thus, charge transfer along the shift register is independent of the phase position of the clocking voltage of the second frequency used to clock the second section of the shift register.

BRIEF DESCRIPTION OF THE DRAWINGS

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings in which:

FIG. 3 is a diagram of voltage waveforms useful in explaining the operation of the charge transfer apparatus of FIGS. 2A and 2B.

FIG. 4A shows another embodiment of apparatus in accordance with the present invention.

FIG. 4B is a plan view of the charge transfer device of FIG. 4A.

DESCRIPTION OF THE PREFERRED EMBODIMENTS

Figure 1A:
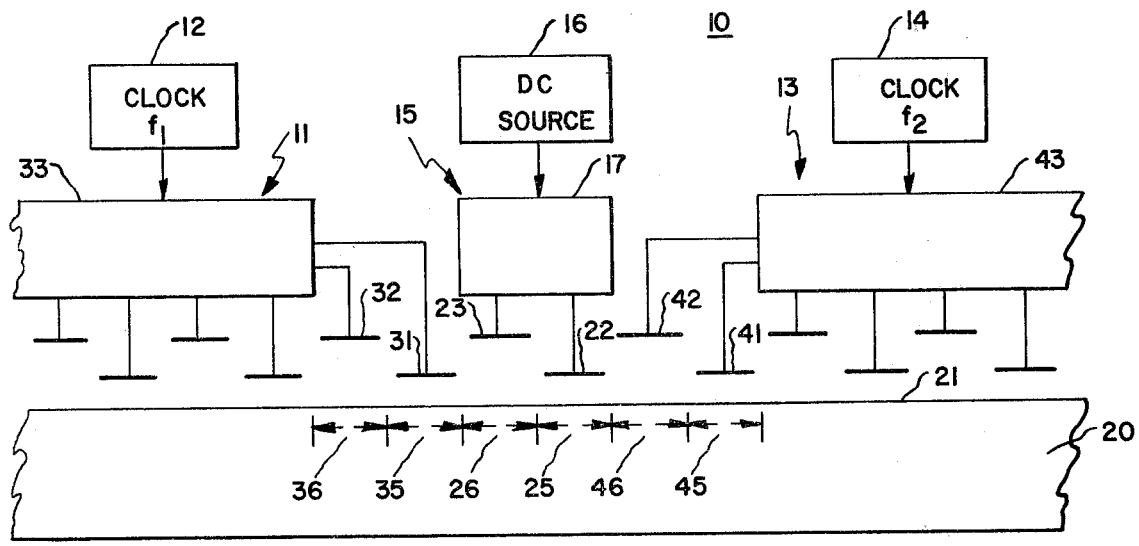
FIG. 1A shows a block diagram of charge transfer apparatus in accordance with the present invention.
Figure 1B:
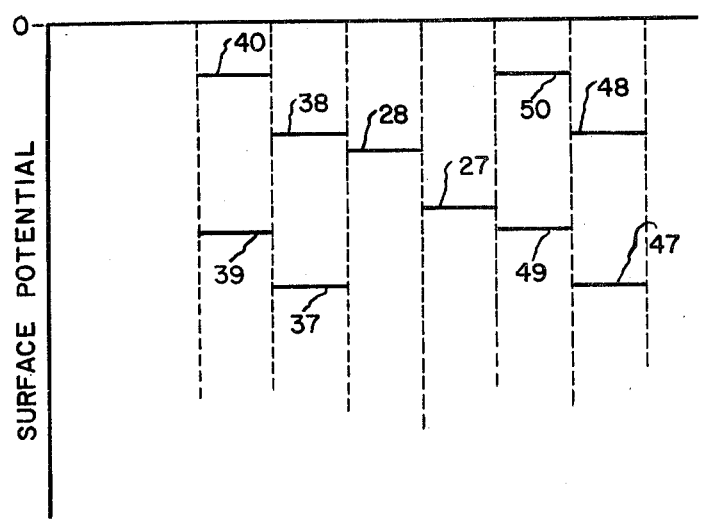
FIG. 1B shows a diagram of semiconductor surface potential versus distance along the semiconductor surface underlying the electrodes of the device of FIG. 1A useful in explaining the operation of the apparatus of FIG. 1A.

Reference is now made to FIGS. 1A and 1B which shows a CCD (charge coupled device) shift register 10 including a first section 11 operated from a first source 12 of clocking voltage of first frequency $f_1$, a second section 13 operated from a second source 14 of clocking voltage of frequency $f_2$, and an intermediate cell 15 operated from a DC voltage source 16. Charge from the last stage of the first shift register 11 is coupled into the intermediate cell 15 at the frequency $f_1$ of the clocking source 12. Charge in the intermediate cell 15 is coupled into the first stage of the second section at the frequency of the clocking voltage source 14. The shift register 10 is formed on a substrate of semiconductor material 20 of N-type conductivity having a major surface 21. The intermediate cell 15 includes a first storage electrode 22 insulatingly overlying the major surface 21 and a first transfer electrode 23 adjacent the first storage electrode 22 and insulatingly overlying the major surface 21. A first interconnection means 17 is provided for applying fixed or DC voltages from the DC source 16 to the first storage electrode 22 and to the first transfer electrode 23 to form in the substrate underlying these electrodes a first storage region 25 and a first transfer region 26, respectively. The spacing of the electrodes 22 and 23 with respect to the substrate and the voltages applied to these electrodes is set so that the surface potential of the first storage region 25, referred to as the first storage level, is energetically lower for minority carriers than the surface potential of the first transfer region 26, referred to as the first transfer level, in the absence of minority carriers in these regions, as shown in FIG. 1B.

The first section of the shift register 10 includes a second storage electrode 31 adjacent the first transfer electrode 23 and insulatingly overlying the major surface 21 of the substrate and a second transfer electrode 32 adjacent the second storage electrode 31 and also insulatingly overlying the major surface 21. A second interconnecting means 33 provides pulsating voltages of a first frequency from clocking voltage source of frequency $f_1$ to the second storage electrode 31 and to the second transfer electrode 32 to form, respectively, a second storage region 35 and a second transfer region 36 in the substrate underlying these electrodes. The surface potential of the second storage region 35 in the absence of charge carriers therein is caused to vary between a second low storage level 37 and a second high storage level 38 in response to the clocking voltage applied to second storage electrode from the clocking voltage source 12. The surface potential of the second transfer region 36 in the absence of charge carriers therein is caused to vary between a second low transfer level 39 and a second high transfer level 40 in response to the clocking voltages applied to second transfer electrode 32 from the clocking voltage source 12. The second low transfer level 39 is higher than the second low storage level 37 and the second high transfer level 40 is higher than the second high storage level 38. Also, the second high storage level 38 is higher than the first transfer level 28.

The storage electrode 31 and the transfer electrode 32 constitute a cell of the last stage of the first section 11 of the shift register 10 and charge is clocked from the other stages of the first section 11 of the shift register 10 at the first frequency $f_1$ into the second storage region 35 when the voltages are applied to the electrodes 31 and 32 which simultaneously produce the low storage level 37 and the low transfer level 39. During the other half of the clocking cycle the voltages applied to the second storage electrode 31 and the second transfer electrode 32 cause the second high storage level 38 and high transfer level 40 to be produced in the substrate and thus charge in this cell is transferred into the intermediate cell 15.

The second section 13 of the shift register 10 includes a third transfer electrode 42 adjacent the first storage electrode 22 and insulatingly overlying the major surface 21 of the substrate and a third storage electrode 41 adjacent the third transfer electrode 42 and also insulatingly overlying the major surface 21. A third interconnecting means 43 interconnects second pulsating voltages of a second frequency $f_2$ from the clock voltage source 14 to the third storage electrode 41 and the third transfer electrode 42 to form a third storage region 45 and a third transfer region 46 in the substrate underlying electrodes 41 and 42, respectively. The surface potential of the third storage region 45 in the absence of charge carriers therein varies between a third low storage level 47 and a third high storage level 48 in response to the clocking voltage applied thereto. The surface potential of the third transfer region 46 in the absence of charge carriers therein varies between a third low storage level 49 and a third high transfer level 50 in response to the clocking voltage from clocking voltage source 14 applied thereto. The spacing of the electrodes 41 and 42 with respect to the major surface 21 of the substrate and the voltages applied thereto are set so that the third low transfer level 49 is higher than the third storage level 47 and the third high transfer level 50 is higher than the third high storage level 48. Also, the voltages applied to the third storage electrode and the third transfer electrode in relation to the DC voltages applied to the first storage electrode 22 and the first transfer electrode 23 are set so that the third transfer high level 50 is higher than the first transfer level 28 and so that the third low transfer level 49 is lower than the first storage level 27. Accordingly, as the second section of the shift register 10 is clocked at the frequency $f_2$ of clocking voltages from source 14 the third storage region 45 and the third transfer region 46 are clocked at this frequency between their low levels and their high levels. Thus, during the occurrence of the low voltage levels in these regions charge is transferred from the first storage region 25 underlying the first storage electrode 22 into the third storage region 45 underlying the third storage electrode 41. The third storage electrode and the third transfer electrode comprise a portion or cell of the first stage of the second section 13 of the shift register. When the clocking voltages from source 14 raises the potentials on these electrodes to their high values charge is transferred from the storage regions lying thereunder to other stages of the second section 13 of the shift register 10.

Thus, charge introduced into the first section 11 of the shift register 10 is clocked from stage to stage until the last stage from which it is clocked into the intermediate or buffer cell at the frequency $f_1$ of the first clock voltage source 12 and independent of the frequency $f_2$ of the second clock voltage source 14. Charge is periodically clocked out of the intermediate cell 15 by the second section 13 of the shift register at the frequency $f_2$ of the second clock voltage source 14 and independent of the frequency $f_1$ of the first clock voltage source 12. Thus, the critical problem of charge build up in the first section of the shift register mentioned above is avoided and dynamic range of the shift register is maintained.

While in the structure described above the charge transferred to the buffer cell from the first section is removed from the buffer cell during a single transfer cycle of the second section, it may be advantageous in some applications of the shift register to remove only a portion of the charge from the intermediate cell during a transfer cycle of the second section. This result may be obtained by appropriately configuring the storage electrode 22 of the buffer cell, for example by increasing the dimension of the storage electrode 22 in the direction of charge transfer. Such a buffer cell structure enables simultaneous storage of several charge samples. Operation of a shift register in which only a fixed fraction of the charge contained in the buffer cell is transferred during each cycle provides a filtering function and inhibits spurious responses.

Figure 2A:
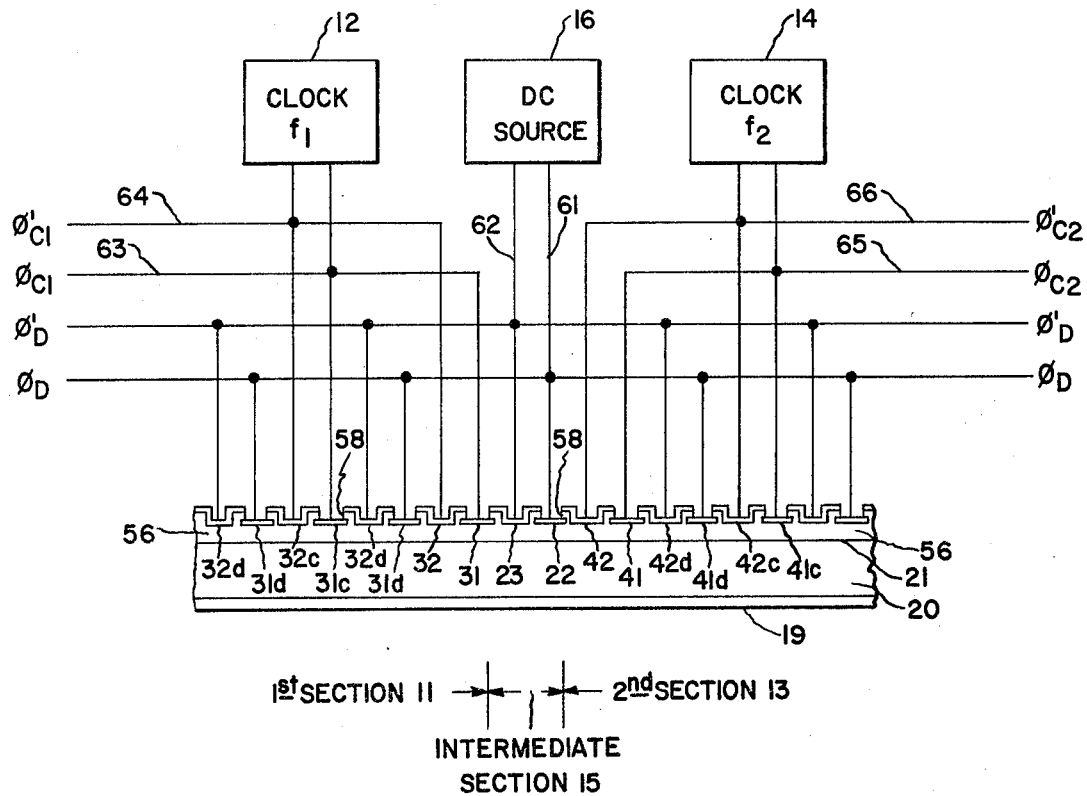
FIG. 2A shows apparatus in accordance with one embodiment of the present invention.
Figure 2B:
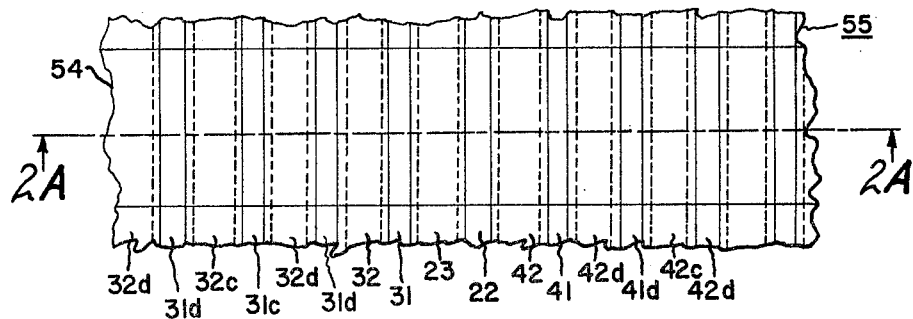
FIG. 2B is a plan view of the charge transfer device of FIG. 2A.

Reference is now made to the apparatus of FIGS. 2A and 2B which shows one manner of implementing the shift register 10 of FIG. 1A. The elements of FIGS. 2A and 2B identical to the elements of FIG. 1A are identically designated. The shift register 10 is formed on a substrate 20 of N-type conductivity, which has a channel portion 54 of uniform width adjacent the major surface 21 of the substrate 20. The channel portion 54 extends in a horizontal direction along the substrate. Typically the substrate 20 may be silicon semiconductor material of 4 ohm centimeter resistivity. Overlying the major surface 21 of the substrate is a thick insulating member 55 having a thin portion 56 which is of generally rectangular outline and lies in registry with the channel portion 54 of the substrate. Storage electrode 22 of the intermediate cell and storage electrodes 31d of the first section 11 of the shift register and also storage electrodes 41d of the second section 13 of the shift register are provided on the insulating member 55 overlying the thin portions 56 thereof. Each of these storage electrodes is of uniform length in the direction of the length of the semiconductor channel portion 54 and each of the electrodes extend across the thin insulating portion 56 and the bordering thick insulating portions of the insulating member 55. Storage electrodes 31 and 31c of the first section 11 of the shift register and storage electrodes 41 and 41c of the second section 13 of the shift register are also provided on the insulating member 55 overlying the thin portion 56. Each of these electrodes is also of uniform length in the direction of the length of the channel portion 54 and each of these electrodes extends across the thin insulating portion 56 and the bordering thick insulating portions of the insulating member 55. Each of the electrodes 31c of the first section 11 is spaced between adjacent electrodes 31d of the first section and also each of the electrodes 41c of the second section 13 are spaced between electrodes 41d of the second section. An insulating layer 58 is provided over the storage electrodes 22, 31, 31c, 31d, 41, 41c, and 41d. Preferably these storage electrodes are constituted of doped polycrystalline silicon. This material may be readily oxidized into a silicon dioxide composition which provides the insulating layer 58 over these electrodes.

Transfer electrodes 32d of the first section 11 of the shift register are provided over the insulating layer 58 and exposed portions of the thin insulating portion 56. Each of the transfer electrodes 32d is insulatingly spaced between and insulatingly overlies respective adjacent storage electrodes 31c and 31d. Each of transfer electrodes 31d is of substantially uniform extent in the direction of the length of the channel portions 54 and extends entirely over the thin insulating portions 56 of the shift register as well as the bordering thick insulating portions thereof. Transfer electrode 23 is provided insulatingly overlying the storage electrode 31 of the last stage of the first section 11 of the shift register and storage electrode 22. Transfer electrode 23 and also transfer electrode 32 are identical in structure to the structure of transfer electrodes 32d of the first section. Transfer electrodes 32c are also provided overlying the insulating layer 58 and exposed portions of the thin portion 46. Each of the transfer electrodes 32c is insulatingly spaced between and insulatingly overlies respective adjacent storage electrodes 31d and 31c.

Transfer electrodes 42d of the second section 13 of the shift register are provided overlying the insulating layer 58 and exposed portions of the thin insulating portion 56. Each of the transfer electrodes 42d is insulatingly spaced between and insulatingly overlies adjacent storage electrodes 41c and 41d. Each of the transfer electrodes 42d is of substantially uniform extent in the direction of the length of the channel portions 54 and extends entirely over the thin insulating portion 56 of the second section of the shift register as well as the bordering thick insulating portions thereof. Transfer electrodes 42c are provided over the insulating layer 58 and exposed portions of the thin portion 56. Each of the transfer electrodes 42c is insulatingly spaced between and insulatingly overlies respective adjacent storage electrodes 41d and 41c. Each of the transfer electrodes 42d is of substantially uniform extent in the direction of the length of the channel portion 54 and extends entirely over the thin insulating portion 56 of the second section of the shift register as well as the bordering thick insulating portions thereof. Transfer electrode 42 of the second section 13 of the shift register is formed identically with transfer electrodes 42c and 42d and insulatingly overlies the first electrode 22 of the intermediate cell 15 and the storage electrode 41 of the second section of the shift register.

The transfer electrodes 23, 32, 32c, 32d, 42, 42c and 42d may be constituted of the same material as the storage electrodes, that is polycrystalline silicon suitably doped to increase the conductivity thereof. Prior to the deposition of the transfer electrodes, the surface of the semiconductor substrate underlying the exposed portions of the thin portion 56 is increased in conductivity by more heavily doping the surface regions with impurities, for example, by ion implantation for increasing the threshold voltage for inversion of the semiconductor surface below the transfer electrodes. Thus, with the same voltage level applied to the transfer electrodes as is applied to the storage electrodes the surface potential of the substrate underlying the transfer electrodes would be greater, that is, less inverted than the surface potential underlying the storage electrodes. Accordingly, a reduced number of clocking voltages are applied to the storage electrodes and the transfer electrodes for functioning of the apparatus, as will be more fully explained below.

The storage electrode 22 is connected to a common line 61 to which a $\phi_D$ voltage is applied. The transfer electrode 23 is connected to a common line 62 to which a $\phi_D'$ voltage is applied. The storage electrodes 41d of the first section 11 and the storage electrodes 41d of the second section 13 are also connected to the common line 61 to which the voltage $\phi_D$ is applied. The transfer electrodes 32d of the first section 11 and the transfer electrodes 42d of the second section 13 are also connected to common line 62 to which the voltage $\phi_D'$ is applied. The storage electrodes 31c of the first section 11 are connected to a common line 63 to which a voltage $\phi_{C1}$ of frequency $f_1$ is applied from source 12. The transfer electrodes 32c of the first section are connected to a common line 64 to which a $\phi_{C1}'$ voltage of frequency $f_1$ is applied from source 12. The storage electrodes 41c of the second section 13 are connected to a common line 65 to which a voltage $\phi_{C2}$ of frequency $f_2$ from source 14 is applied and the transfer electrodes 42c of the second section of the shift register is connected to a common line 66 to which a voltage $\phi_{C2}'$ of frequency $f_2$ from source 14 is applied. The voltages $\phi_D$ and $\phi_D'$, $\phi_{C1}$ and $\phi_{C1}'$, and $\phi_{C2}$ and $\phi_{C2}'$ are shown in FIG. 3. The voltages $\phi_D$ and $\phi_D'$ are DC voltages. The voltages $\phi_{C1}$ and $\phi_{C1}'$ are identical clocking voltages of frequency $f_1$ and the voltages $\phi_{C2}$ and $\phi_{C2}'$ are identical clocking voltages of frequency $f_2$. Conductive layer 19 constituted of a suitable material such as gold is bonded to the lower surface of the substrate 20 to provide an ohmic contact therewith.

The system of voltages utilized to clock the first and second sections of the shift register are referred to as a single phase system in that a fixed voltage is applied to electrodes 31d and 32d constituting a first cell of a stage of the first section and an alternating voltage shifting between low and high levels is applied to the electrodes 31c and 32c constituting a second cell of a stage of the first section. The clocking voltages $\phi_{C1}$ and $\phi_{C1}'$ applied to the second cell cause the surface potentials of the storage and transfer regions underlying these electrodes to cycle below and above the potential of the surface potentials underlying the electrodes of the first cell. Accordingly, charge is alternately transferred into the storage regions of the first cell when these clocking voltages are at their high level and is transferred out of the storage regions of the first cell into the storage regions of the second cell when these voltages are at their low level. The second section of the shift register is similarly constituted of a first and a second cell. The clocking voltages $\phi_{C2}$ and $\phi_{C2}'$ applied to the electrodes of the second cell cause it to cycle below and above the surface potentials appearing in the storage and transfer regions of the first cell thereby effecting the transfer of charge along the shift register at the frequency $f_2$.

Figure 5:
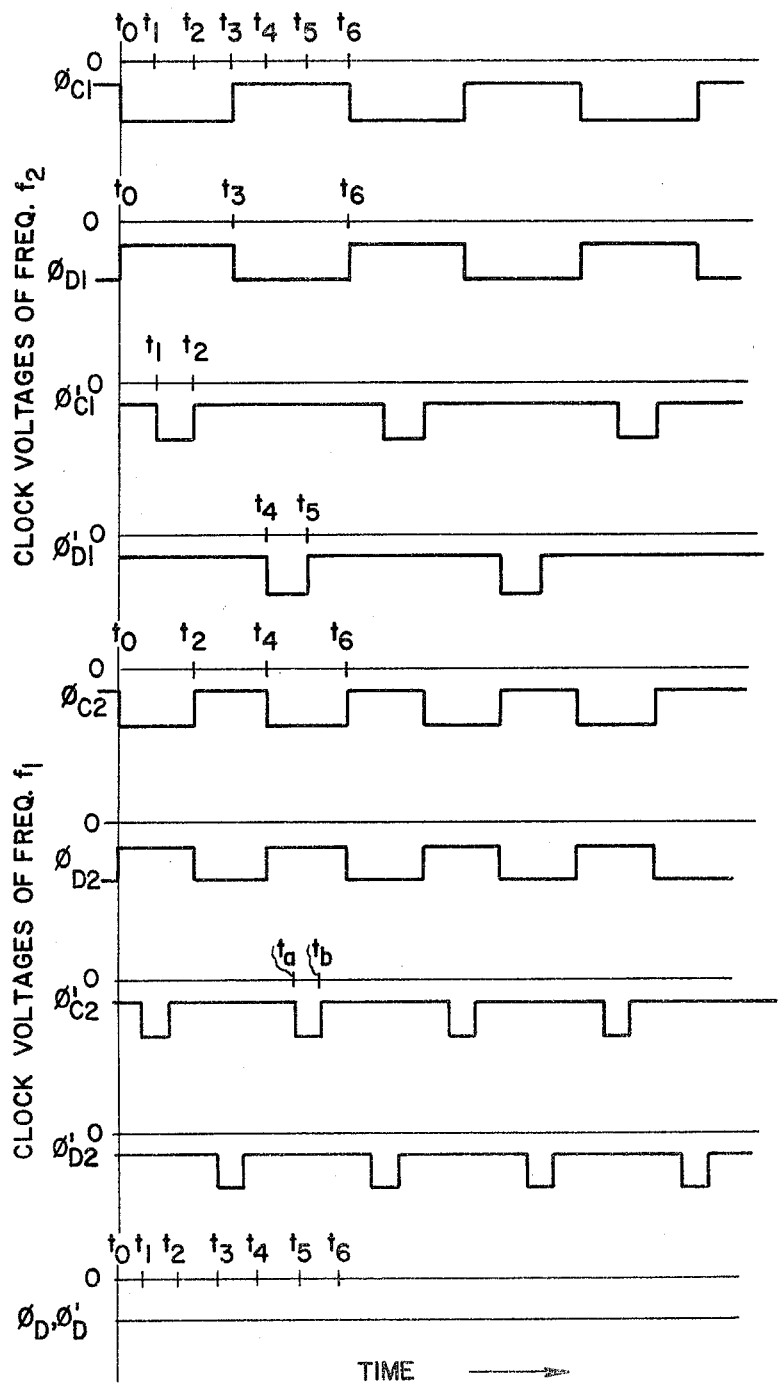
FIG. 5 is a diagram of voltage waveforms useful in explaining the operation of the embodiment of the apparatus of FIGS. 4A and 4B.

Reference is now made to FIGS. 4A and 4B which shows apparatus in accordance with another embodiment of the present invention. The apparatus is identical to the apparatus of FIGS. 2A and 2B except that interconnections to the electrodes of the apparatus and the clocking voltages applied thereto provide two phase clocking in the first and second sections of the shift register. The elements of the apparatus of FIGS. 4A and 4B identical to the elements of the apparatus of FIGS. 2A and 2B are identically designated. Electrodes 22 and 23 of the intermediate cell are connected respectively to lines 61 and 62 to which respectively $\phi_D$ and $\phi_D'$ voltages are applied from source 16. The $\phi_D$ and $\phi_D'$ voltages are fixed d-c voltages and are shown in FIG. 5. The storage electrode 31d of the first section are connected to a common line 71 to which a voltage $\phi_{D1}$ is applied. The transfer electrodes 32d are connected to a common line 72 to which a voltage $\phi_{D1}'$ is applied. The storage electrodes 31c are connected to a common line 73 to which a voltage $\phi_{C1}$ is applied and the transfer electrodes 32c are connected to a common line 74 to which a voltage $\phi_{C1}'$ is applied. Similarly, the storage electrodes 41d of the second section of the shift register are connected to a common line 75 to which a voltage $\phi_{D2}$ is applied. The transfer electrodes 42d are connected to a common line 76 to which a voltage $\phi_{D2}'$ is connected. The storage electrodes 41c are connected to a common line 77 to which a voltage $\phi_{C2}$ is applied and the transfer electrodes 42c are connected to a common line 78 to which a voltage $\phi_{C2}'$ is connected. The clocking voltages $\phi_{D1}$, $\phi_{D1}'$, $\phi_{C1}$ and $\phi_{C1}'$ of the first section 11 and also the clocking voltages $\phi_{D2}$, $\phi_{D2}'$, $\phi_{C2}$ and $\phi_{C2}'$ of the second section 13 are shown in FIG. 5.

The operation of the first section of the shift register will be described in connection with the voltage waveforms of FIG. 5. The voltage waveform $\phi_{C1}$ applied to a storage electrode 31c establishes a low level of surface potential in the storage region underlying this electrode during the interval $t_0-t_3$, and the voltage $\phi_{D1}$ applied to adjacent storage electrodes 31d establishes a high level of surface potential in the region underlying this electrode during the interval $t_0-t_3$. On the occurrence of the pulse of the voltage waveform $\phi_{C1}'$ during the interval $t_1-t_2$ applied to electrode 32c located between these two electrodes, charge flows from the storage region underlying the electrode 31d into the storage region underlying the electrode 31c. Upon termination of the pulse of voltage $\phi_{C1}'$ charge transfer is stopped. Over the next half cycle from instant $t_3$ to instant $t_6$ the reverse conditions exist, that is the voltage on an electrode 31c is high and the voltage on an adjacent electrode 31d is low. Thus conditions are set for the transfer of charge from storage regions underlying the electrodes 31c to storage regions underlying the electrodes 31d. This occurs during interval $t_4-t_5$ when the voltage on the transfer electrodes 32d is lowered to complete a cycle of transfer. Transfer of charge takes place at the frequency $f_1$ of the clocking voltages $\phi_{C1}$ and $\phi_{D1}$. The operation of the second section of the shift register to which the voltages $\phi_{C2}$, $\phi_{D2}$, $\phi_{C2}'$ and $\phi_{D2}'$ are applied is identical except that the charge transfer takes place at frequency $f_2$ as indicated in the waveform diagrams of FIG. 5. Charge is transferred from the last stage of the first section 11 into the storage region underlying electrode 22 during the interval $t_3-t_6$ when voltage on electrode 31 is high, i.e. above the voltage $\phi_D$ on electrode 22. Charge is transferred out of the storage region underlying electrode 22 during the interval $t_a-t_b$ when the voltage on $\phi_{C2}$ electrode 41 and electrode $\phi_{C2}'$ are low.

While the embodiment of the invention shown in FIGS. 4A and 4B employs two phase shift register sections, it is apparent that other embodiments may employ three or more phase sections. In such embodiments appropriately phased voltages would be applied to the electrodes of the first section to transfer charge into the intermediate cell and to the second section to transfer charge out of the intermediate cell.

While the invention has been described in specific embodiments, it will be understood that modifications, such as those described above, may be made by those skilled in the art and it is intended by the appended claims to cover all such modifications and changes as fall within the true spirit and scope of the invention.

We claim:

1. In combination
   a substrate of semiconductor material of one conductivity type having a major surface,
   a first storage electrode insulatingly overlying said major surface,
   a first transfer electrode adjacent said first electrode and insulatingly overlying said major surface,
   means for applying fixed voltages to said first storage and said first transfer electrode to form in said substrate a first storage region and a first transfer region respectively, the surface potential of said first storage region having a first storage level and the surface potential of said first transfer region having a first transfer level in the absence of minority carriers therein, said first storage level being energetically lower than said first transfer level for minority carriers in said substrate,
   a second storage electrode adjacent said first transfer electrode and insulatingly overlying said major surface,
   a second transfer electrode adjacent said second storage electrode and insulatingly overlying said major surface,
   means for applying first pulsating voltages of a first frequency to said second storage and said second transfer electrodes to form in said substrate a second storage region and a second transfer region respectively, the surface potential of said second storage region in the absence of charge carriers therein varying between a second low storage level and a second high storage level, the surface potential of said second transfer region in the absence of charge therein varying between a second low transfer level and a second high transfer level, said second low transfer level being higher than said second low storage level, and said second high transfer level being higher than said second high storage level, said second high storage level being higher than said first transfer level,
   a third transfer electrode adjacent said first storage electrode and insulatingly overlying said major surface,
   a third storage electrode adjacent said third transfer electrode and insulatingly overlying said major surface,
   means for applying second pulsating voltages of a second frequency to said third storage electrode and said third transfer electrode to form in said substrate a third storage region and a third transfer region respectively, the surface potential of said third storage region in the absence of charge carriers therein varying between a third low storage level and a third high storage level, the surface potential of said third transfer region in the absence of charge therein varying between a third low transfer level and third high transfer level, said third low transfer level being higher than said third low storage level and said third high transfer level being higher than said third high storage level, said third low transfer level being lower than said first storage level and said third high transfer level being higher than said first storage level and said first transfer level, first means for transferring charge periodically at said first frequency into said second storage region during the occurrence of said second low storage level, whereby during the occurrence of said second high storage level charge is transferred from said second storage region into said first storage region and during the occurrence of said third low storage level charge is transferred from said first storage region into said third storage region, said first means for transferring charge comprising a first charge transfer shift register including a plurality of stages, the last stage of which includes said second storage electrode, second means for transferring charge periodically at said second frequency from said third storage region during the occurrence of said third high storage level, said second means for transferring charge comprising a second charge transfer shift register including a plurality of stages, the dimension of said first storage electrode in the direction of charge transfer thereunder being greater than the dimension of the storage electrodes of said second shift register in the direction of transfer of charge thereunder.

* * * * *